United States Patent
Daubenspeck et al.

(10) Patent No.: US 7,545,050 B1
(45) Date of Patent: *Jun. 9, 2009

(54) DESIGN STRUCTURE FOR FINAL VIA DESIGNS FOR CHIP STRESS REDUCTION

(75) Inventors: Timothy Harrison Daubenspeck, Colchester, VT (US); Wolfgang Sauter, Hinesburg, VT (US); Jeffrey P. Gambino, Westford, VT (US); David L. Questad, Hopewell Junction, NY (US)

(73) Assignee: International Business Machiens Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/183,369

(22) Filed: Jul. 31, 2008

Related U.S. Application Data

(63) Continuation of application No. 12/044,692, filed on Mar. 7, 2008, now Pat. No. 7,439,170.

(51) Int. Cl.
*H01L 23/48* (2006.01)
(52) U.S. Cl. .................................. 257/779
(58) Field of Classification Search ......... 257/779–784, 257/E23.052; 361/56–60; 438/131
See application file for complete search history.

(56) References Cited

U.S. PATENT DOCUMENTS

| | | | |
|---|---|---|---|
| 6,667,557 B2 | 12/2003 | Alcoe et al. | |
| 7,273,770 B2 | 9/2007 | Edelstein et al. | |
| 2005/0258539 A1* | 11/2005 | Minda | 257/738 |
| 2006/0292711 A1* | 12/2006 | Su et al. | 438/14 |
| 2008/0080113 A1* | 4/2008 | Lin et al. | 361/56 |
| 2009/0015285 A1* | 1/2009 | Farooq et al. | 324/763 |
| 2009/0017565 A1* | 1/2009 | Hasebe et al. | 438/17 |

* cited by examiner

*Primary Examiner*—Nathan W Ha
(74) *Attorney, Agent, or Firm*—The Law Firm of Andrea Hence Evans, LLC

(57) ABSTRACT

A design structure to provide a package for a semiconductor chip that minimizes the stresses and strains that arise from differential thermal expansion in chip to substrate or chip to card interconnections. An improved set of design structure vias above the final copper metallization level that mitigate shocks during semiconductor assembly and testing. Other embodiments include design structures having varying micro-mechanical support structures that further minimize stress and strain in the semiconductor package.

1 Claim, 6 Drawing Sheets

US 7,545,050 B1

DESIGN STRUCTURE FOR FINAL VIA DESIGNS FOR CHIP STRESS REDUCTION

RELATED APPLICATIONS

The present application is a continuation of prior U.S. application Ser. No. 12/044,692, filed Mar. 7, 2008, the entirety of which is incorporated herein by reference.

FIELD OF THE INVENTION

The present invention relates to design structure. More specifically, the present invention relates to the design structure for microelectronic packaging of semiconductor chips and, more specifically, to the process of manufacturing IC flip chip assemblies designed to reduce the structural damage to C4 interconnections due to thermal stress and the CTE mismatch of the chip and the packaging material.

BACKGROUND OF THE INVENTION

Advances in microelectronics technology tend to develop chips that occupy less physical space while performing more electronic functions. Conventionally, each chip is packaged for use in housings that protect the chip from its environment and provide input/output communication between the chip and external circuitry through sockets or solder connections to a circuit board or the like. Miniaturization results in generating more heat in less physical space, with less structure for transferring heat from the package.

The heat of concern is derived from wiring resistance and active components switching. The temperature of the chip and substrate rises each time the device is turned on and falls each time the device is turned off. As the chip and the substrate ordinarily are formed from different materials having different coefficients of thermal expansion (CTE), the chip and structure tend to expand and contract by different amounts, a phenomenon known as CTE mismatch. This causes the electrical contacts on the chip to move relative to the electrical contact pads on the substrate as the temperature of the chip and substrate changes. This relative movement deforms the electrical interconnections between the chip and printed wiring board (PWB) and places them under mechanical stress. These stresses are applied repeatedly with repeated operation of the device, and can cause fatigue of the electrical interconnections. This is especially true for the solder ball of the controlled collapse chip connection, also known as "C4", connections. It is therefore important to mitigate the substantial stress caused by thermal cycling as temperatures within the device change during operation.

CTE mismatch is indeed a concern. However, a second primary source of thermal cycling concerns the stresses encountered in the assembly of the chip to the packaging substrate. During this process, the solder ball must be heated and softened by reflow so that it can join the chip to the solder pad on the substrate. During cool-down of the chip-join process, considerable vertical tensile and shear stresses are translated through the solder ball to the underlying chip-level wiring. These stresses can cause the physical breakage of dielectric and wiring levels. These stresses can be a greater threat to proper chip functioning than the stresses discussed the paragraph above.

One type of semiconductor chip package includes one or more semiconductor chips mounted on a circuitized surface of a substrate (e.g., a ceramic substrate or a plastic composite substrate). Such a semiconductor chip package is usually intended for mounting on a printed circuit card or board. In the case of a ball grid array (BGA) package, the chip carrier includes a second circuitized surface opposite the surface to which the chip is attached. This, in turn, is connected to the printed circuit card or board. Chip carriers of this type provide a relatively high density of chip connections and are readily achieved by mounting one or more semiconductor chips on the circuitized surface of a chip carrier substrate in the so-called "flip chip" configuration.

Another type of attachment is called direct chip attach (DCA). For direct chip attache, individual IC chips are mounted on the cards or boards. The space between the mounted chip and the card or board is then filled with an epoxy resin. By this expedient, the standoff between the IC chip and the card or board is encapsulated with epoxy.

However, one problem encountered with the combination of DCA and C4 bonding is the difficulty of reworking the encapsulated package. In order to improve rework and to accommodate the CTE mismatches between the chip and the PWB, many prior art proposals have been developed to connect integrated circuit chips to printed wiring boards via an intermediate element. Often, chip carriers are interposed between the chip and the circuit board; the CTE of the chip carrier is itself chosen as some intermediate value to provide a reasonable match to both the chip and to the printed circuit board. The very large difference in CTE between the silicon device and the printed circuit board generally requires some intermediate device carrier to reduce localized delamination or white bumps. One such type of interconnection mounts the integrated circuit chip on a ceramic chip carrier or module, which module is mounted on a circuit board. One or more chips may be mounted on each device carrier or module, and one or more modules may be mounted on any given circuit board. In a particularly well known type of configuration, the integrated circuit chip is mounted onto a ceramic module by flip chip bonding wherein the I/O pads on the face of the chip are bonded to corresponding pads on the module. Such connections are formed by solder bumps or solder balls normally using solder reflow techniques. It is these connections that are referred to as C4 connections.

FIG. 1 is a top view of a prior art metal pad 100 for a solder bump interconnection. The metal pad 100 has final passivation opening 102 of 47 um and via in hard dielectric passivation connection 101 of 64 um.

FIG. 3 is a side perspective view of the prior art of FIG. 1. Metal pad 300 has a solder bump 301 according to C4 technology. The solder bump 301 is lead free and preferably a SnAg Pb-free solder. Below the solder bump 301 is a ball limiting metallurgy 302. Below the ball limiting metallurgy 302 is final passivation opening/layer 303 of approximately 47 um containing photosensitive polyimide which is over aluminum pad level 304. Below the aluminum pad 304 is the via and electrical connection opening 305 of approximately 64 um. Below the TV opening 305 is the last copper wiring level 306. The via 307 lies directly below the last metallization level 306. Finally, copper pads/wires level 308 is provided to make circuitry connections. For purposes of comparison, the relative stress level in the oxide under the last metallization level 306 in dashed boxes 309, 309' and 309" for this configuration is 1 where values greater than 1 have higher stress and values below 1 have lower stress. The areas 309, 309' and 309" represent high stress areas under the photosensitive polyimide edge in the prior art.

SUMMARY OF THE INVENTION

Accordingly, it is a general aspect of an embodiment of the present invention to provide novel and useful semiconductor devices wherein the foregoing problems are mitigated.

It is another aspect of an embodiment of the present invention to provide a design structure for a semiconductor chip with on-chip visa to mitigate differences in CTE.

It is yet another aspect of an embodiment of the present invention to provide a design structure for an improved ball limiting metallurgy to mitigate stresses experienced during semiconductor packaging and testing.

It is a further aspect of an embodiment of the present invention to provide a design structure for an improved via system to further mitigate stresses in semiconductor chip packages.

BRIEF DESCRIPTION OF THE DRAWINGS

A complete understanding of the present invention may be obtained by reference to the accompanying drawings (not drawn to scale) when considered in conjunction with the subsequent detailed description, in which.

DETAILED DESCRIPTION OF THE INVENTION

Figure 1:
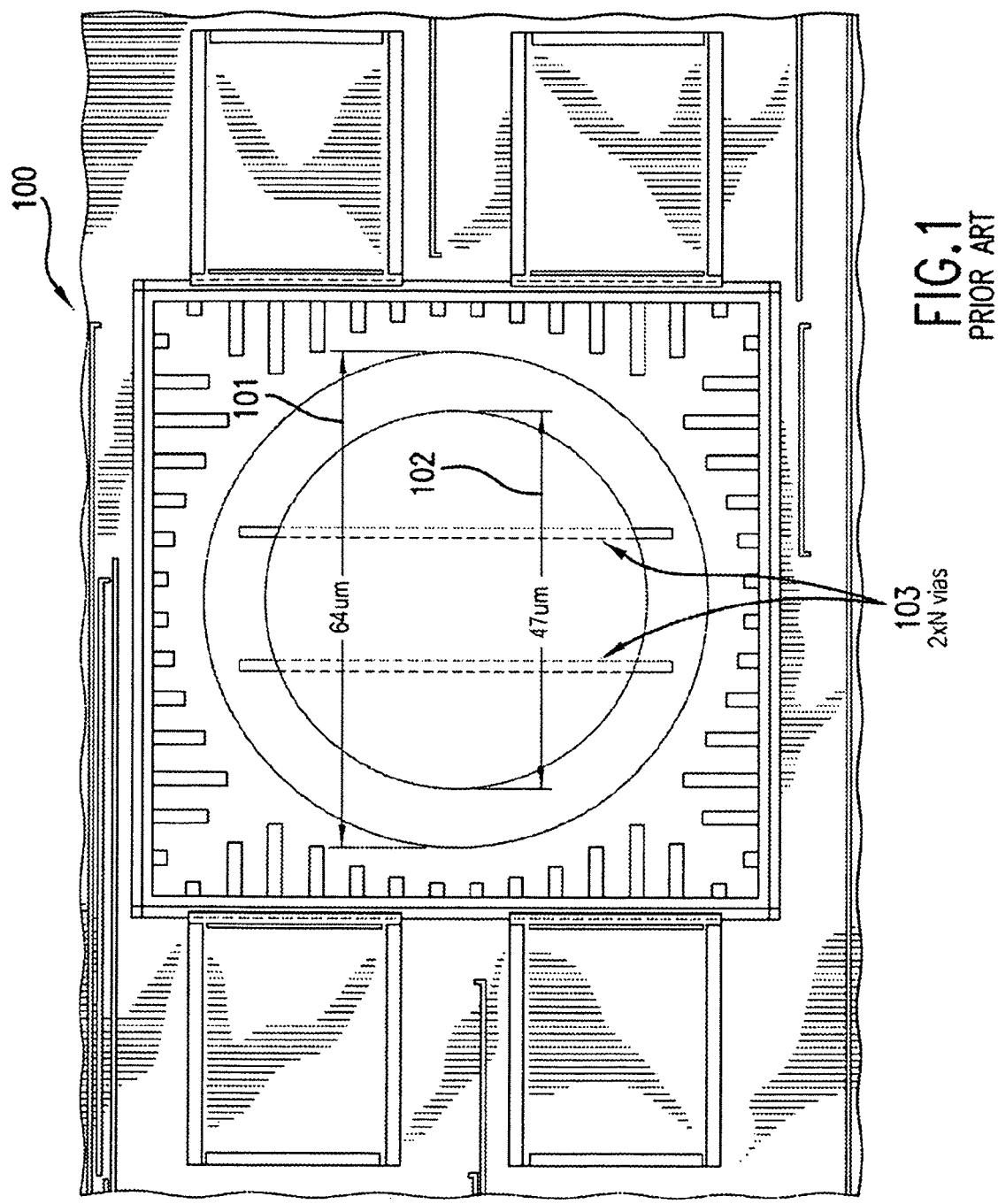
FIG. 1 is a top view of the prior art.
Figure 2:
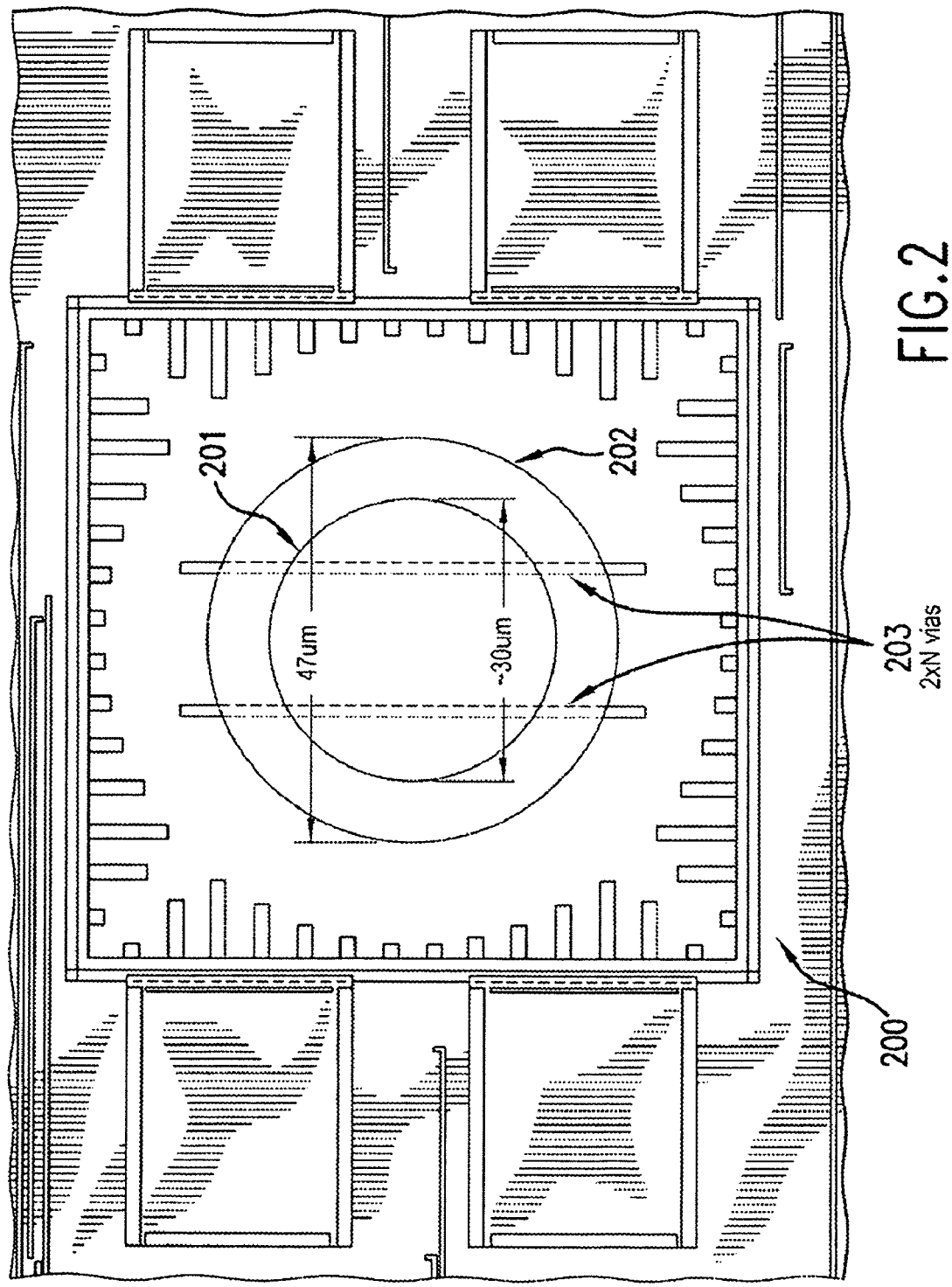
FIG. 2 is a top view of a first embodiment of the present invention.

FIG. 2 is a top view of first embodiment of the metal pad 200 for a solder bump interconnection. The metal pad 300 has a final passivation opening 202 of 47 um and via in hard dielectric passivation opening 201 of 30 um. This embodiment is not limited to the specific dimensions recited here above. Those skilled in the art will recognize that modifications may be made without departing from the spirit of the present invention.

Figure 4:
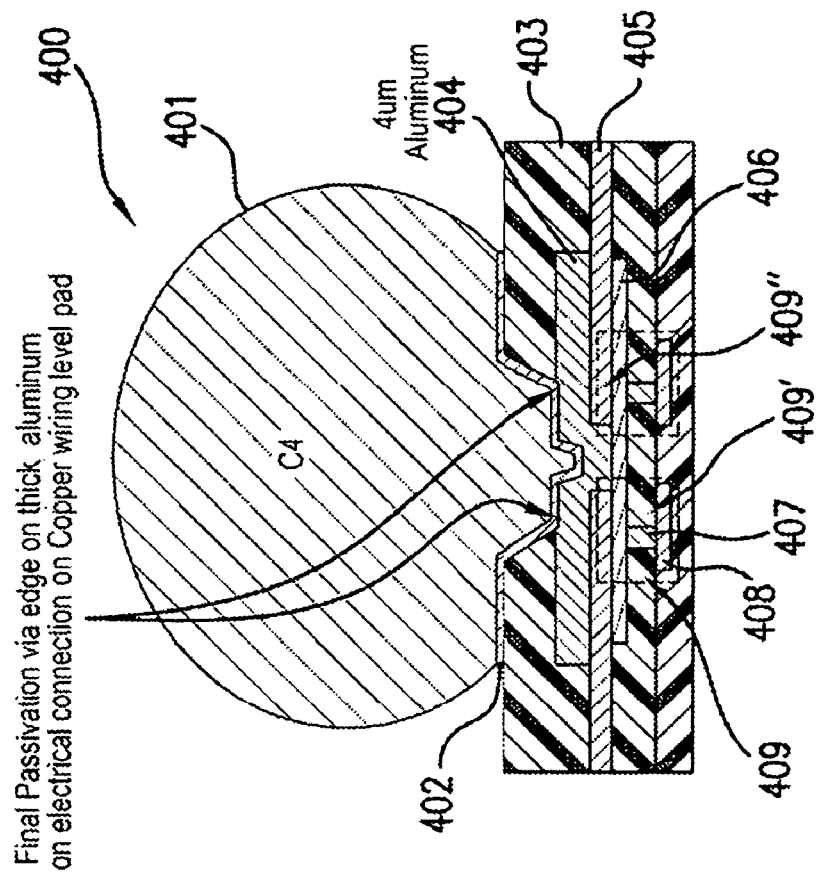
FIG. 4 is a cross-sectional view of the embodiment of FIG. 2.
Figure 3:
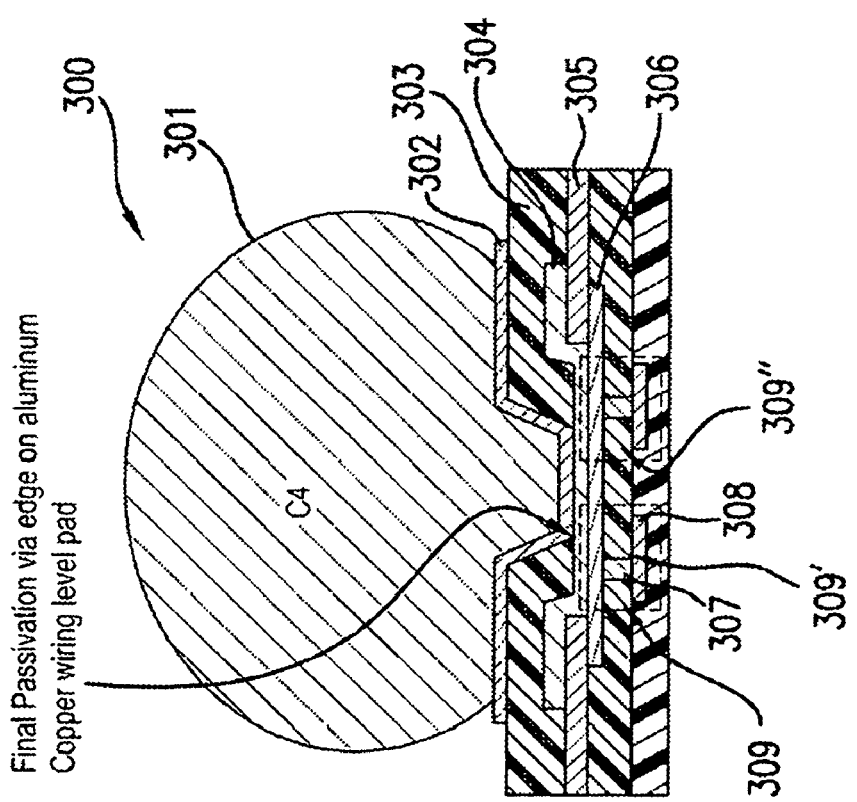
FIG. 3 is a cross-sectional view of FIG. 1.

FIG. 4 is a cross-sectional perspective view of the embodiment of FIG. 2. Metal pad 400 has a solder bump 401 according to C4 technology. The solder bump 401 is lead free and preferably a SnAg Pb-free solder. Below the solder bump 401 is a ball limiting metallurgy 402. The ball limiting metallurgy 402 may be composed of any metallurgy known effective in the art. Preferably, the ball limiting metallurgy 402 is cooper/nickel metallurgy. Below the ball limiting metallurgy 402 is final passivation opening/layer 403 of approximately 47 um containing photosensitive polyimide which is over thickened aluminum pad level 404. The thickened aluminum pad preferably 4 um tall. Below the thickened aluminum pad 404 is the via in hard dielectric passivation 405 of approximately 30 um. This embodiment allows for the via in hard dielectric passivation opening 405 to be well contained within the final passivation 403. The final passivation 403 via edge is supported by thickened aluminum pad 404 which is on the via in hard dielectric passivation connection opening 405 which is on the last metallization pad 406. Below the via in hard dielectric passivation level opening 405 is the last copper wiring level 406. Via 407 represents a via of reduced stress and strain of the present invention. The via 407 lies directly below the last metallization level 406. Finally, copper pads/wires level 408 is provided to make circuitry connections. Finite element modeling indicates that that the worst case relative stress level for this for this embodiment is on the order of ⅓ that of the prior art structure of FIG. 3. The dashed box areas 409, 409' and 409" are the new reduced stress areas now protected by the thickened aluminum pad 404. This embodiment is not limited to the specific dimensions and/or materials recited here above. Those skilled in the art will recognize that modifications may be made without departing from the spirit of the present invention.

Figure 5:
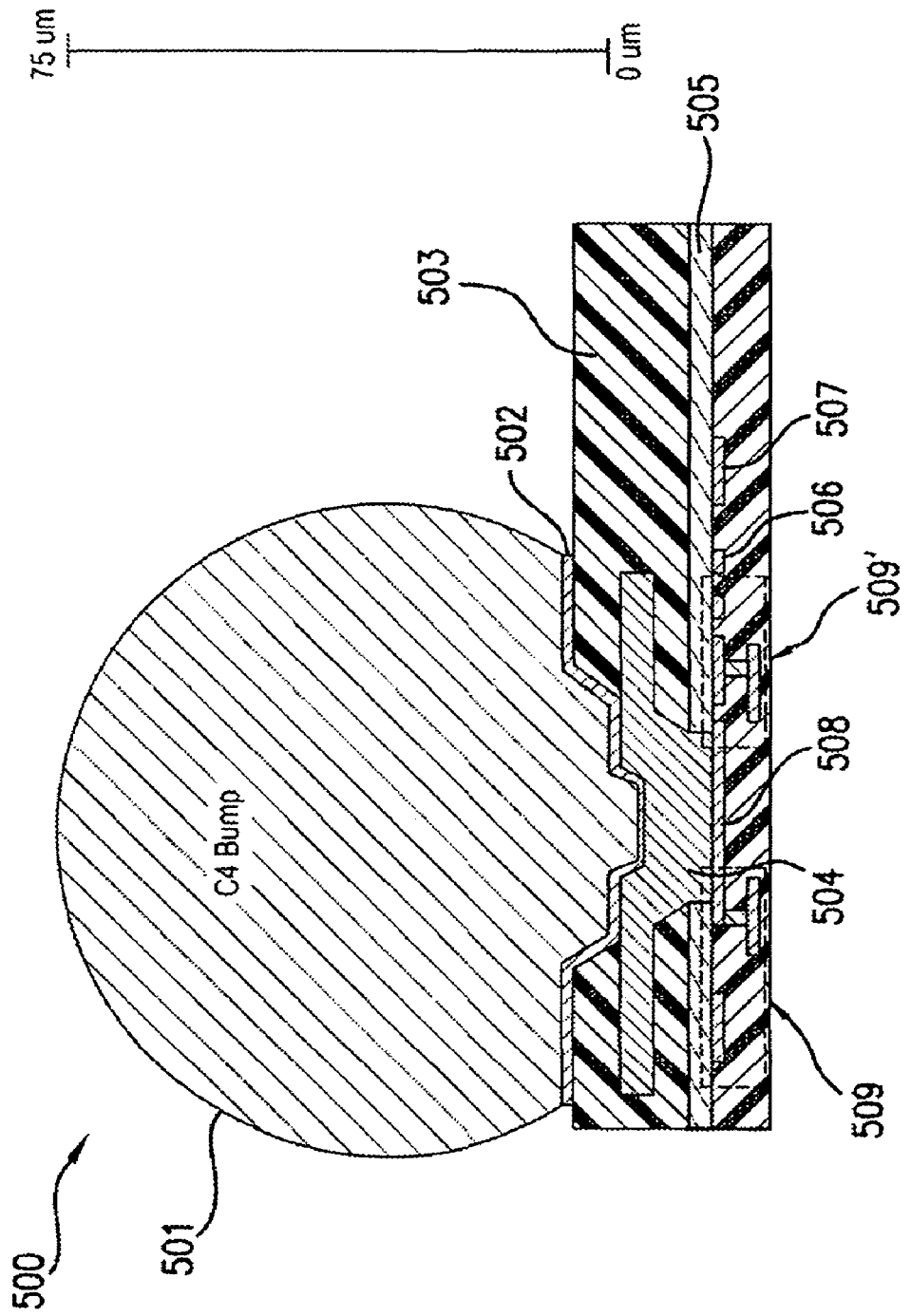
FIG. 5 is a cross-sectional view of a second embodiment of the present invention.

FIG. 5 is a cross-sectional perspective view of a second embodiment of the present invention. The metal pad 500 has solder bump 501 above BLM 502. BLM 502 is supported by both photosensitive polyimide 503 and aluminum pad 504. The aluminum pad 504 is also supported by photosensitive polyimide 503. The via in hard dielectric passivation level 505 has an oxide/nitride composition and supports the photosensitive polyimide 503. Circuitry connections 506 are installed below the via in hard dielectric passivation level 505. Copper pad/wire connections 507 are adjacent the circuitry connections 506. Finally, the last metallization 508 is installed below aluminum pad 504. The dashed box areas 509 and 509' are the reduced stress areas now protected by thickened aluminum pad 504 and the via in hard dielectric passivation level 505. This embodiment is not limited to the specific dimensions and/or materials recited here above. Those skilled in the art will recognize that modifications may be made without departing from the spirit of the present invention.

Figure 6:
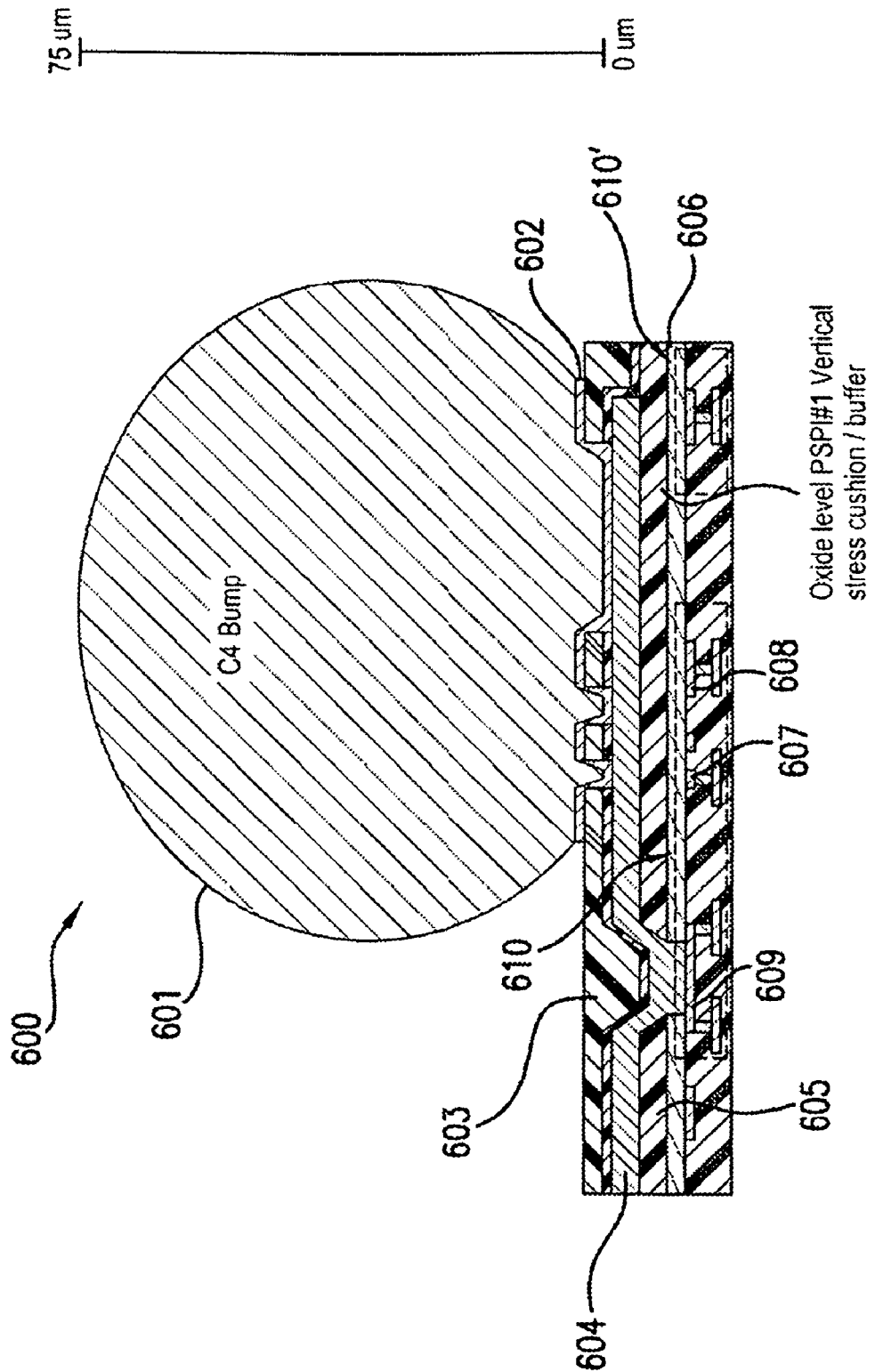
FIG. 6 is a cross-sectional view of a third embodiment of the present invention.

FIG. 6 is a cross-sectional perspective view of a third embodiment of the present invention. The metal pad 600 has solder bump 601 above ball limiting metallurgy 602. Ball limiting metallurgy 602 is supported by both photosensitive polyimide level 603 and aluminum pad 604. The aluminum pad 604 is also supported by photosensitive polyimide level #2 605. Wiring connection 606 has an oxide composition and supports the aluminum pad 604. Wiring connections 607 are installed below wiring connection 606. Copper pad/wire connections 608 are adjacent the wiring connection 607. Finally, the last metallization copper level 609 is installed below aluminum pad 604. Dashed box areas 610 and 610' represent reduced stress areas protected by photosensitive polyimide levels #1 and 2 at 605. This embodiment is not limited to the specific dimensions and/or materials recited herein above. Those skilled in the art will recognize that modifications may be made without departing from the spirit of the present invention.

Figure 7:
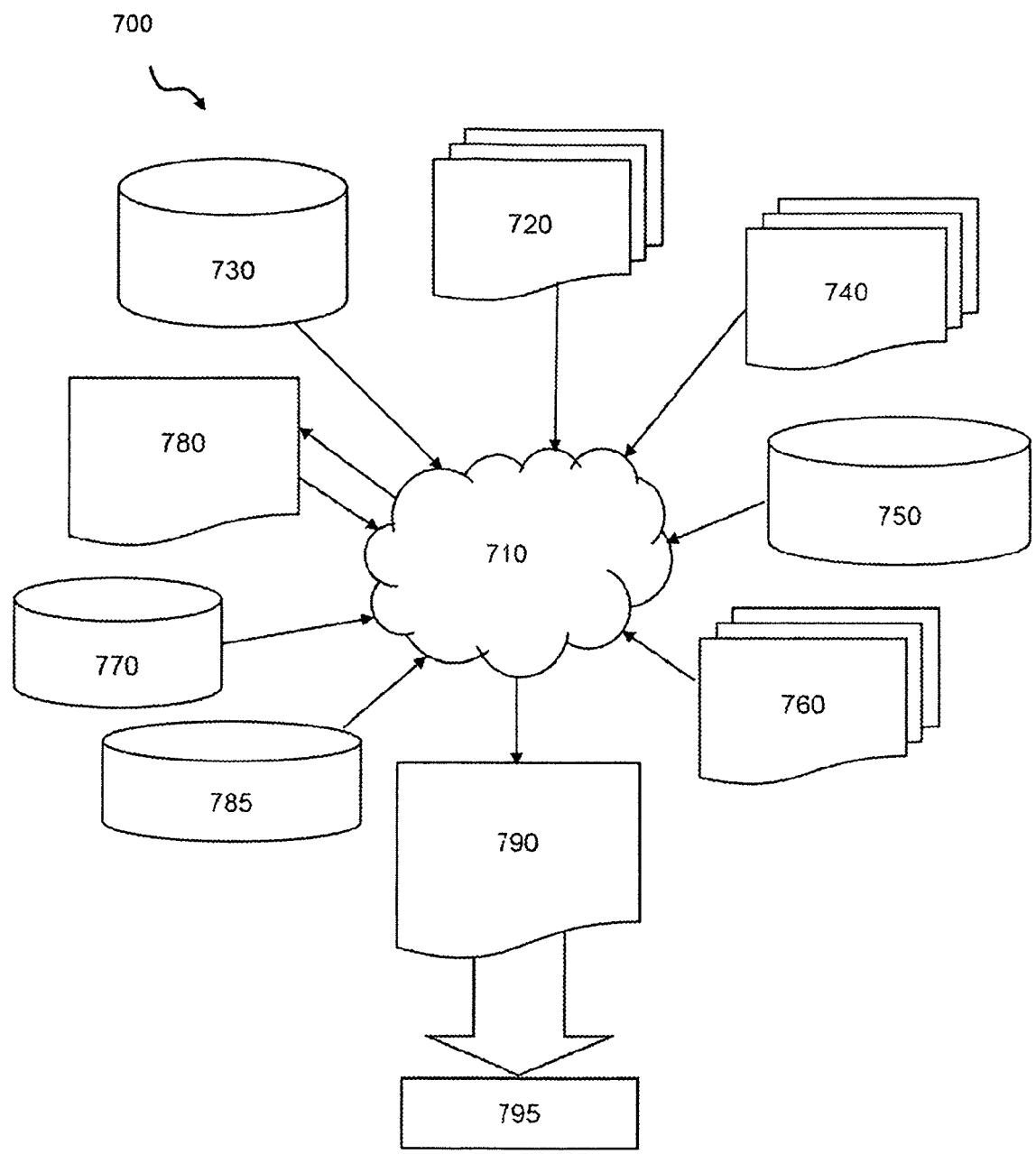
FIG. 7 is a flow diagram of the design process used in semiconductor design, manufacture and/or test.

FIG. 7 shows a block diagram of an exemplary design flow 700 used for example, in semiconductor design, manufacturing, and/or test. Design flow 700 may vary depending on the type of IC being design. For example, a design flow 700 for building an application specific IC (ASIC) may differ from a design flow 700 for designing a standard component. Design structure 720 is preferably an input to a design process 710 and may come from an IP provider, a core developer, or other design company or may be generated by the operator of the design flow, or from other sources. Design structure 720 comprises an embodiment of the invention as shown in FIGS. 2, 4-6 in the form of schematics or HDL, a hardware-description language (e.g., Verilog, VHDL, C, etc.). Design structure 720 may be contained on one or more machine readable medium. For example, design structure 720 may be a text file or a graphical representation of an embodiment of the invention as shown in FIGS. 2, 4-6. Design process 710 preferably synthesizes (or translates) an embodiment of the invention as shown in FIGS. 2, 4-6 into a netlist 780, where netlist 780 is, for example, a list of wires, transistors, logic gates, control circuits, I/O, models, etc. that describes the connections to other elements and circuits in an integrated circuit design and recorded on at least one of machine readable medium. This may be an iterative process in which netlist 780 is resynthesized one or more times depending on design specifications and parameters for the circuit.

Design process 710 may include using a variety of inputs; for example, inputs from library elements 730 which may house a set of commonly used elements, circuits, and devices, including models, layouts, and symbolic representations, for a given manufacturing technology (e.g., different technology nodes, 32 nm, 45 nm, 90 nm, etc.), design specifications 740, characterization data 750, verification data 760, design rules 770, and test data files 785 (which may include test patterns and other testing information). Design process 710 may further include, for example, standard circuit design processes such as timing analysis, verification, design rule checking, place and route operations, etc. One of ordinary skill in the art of integrated circuit design can appreciate the extent of possible electronic design automation tools and applications used in design process 710 without deviating from the scope and spirit of the invention. The design structure of the invention is not limited to any specific design flow.

Design process 710 preferably translates an embodiment of the invention as shown in FIGS. 2, 4-6, along with any additional integrated circuit design or data (if applicable), into a second design structure 790. Design structure 790 resides on a storage medium in a data format used for the exchange of a layout data of integrated circuits and/or symbolic data format (e.g. information stored in a GDSII (GDS2), GL1, OASIS, map files, or any other suitable format for storing such design structures). Design structure 790 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 2, 4-6. Design structure 790 may then proceed to a stage 795 where, for example, design structure 790: proceeds to tape-out, is released to manufacturing, is released to a mask house, is sent to another design house, is sent back to the customer, etc.

The invention has been described in detail with particular reference to certain preferred embodiments thereof, but it will be understood that variations and modifications can be effected within the spirit and scope of the invention.

The invention claimed is:

1. A semiconductor package comprising:
   at least one ball limiting metallurgy layer;
   at least one final passivation layer having at least one final passivation layer via wherein the at least one final passivation layer via has a diameter,
   wherein the final passivation layer is below the ball limiting metallurgy layer;
   at least one aluminum layer in a via in a hard dielectric passivation layer;
   said aluminum layer having at least one projection wherein a portion of the final passivation layer is above the at least one projection and a portion of the final passivation layer is below the at least one projection;
   said via in a hard dielectric passivation layer having a smaller diameter than the final passivation layer via diameter;
   at least one last metallization copper layer below the aluminum layer;
   at least one via below the last metallization copper layer with a reduced stress and stain in the semiconductor package.

* * * * *